United States Patent
Kim

(10) Patent No.: US 11,217,776 B2
(45) Date of Patent: Jan. 4, 2022

(54) LIGHT EMITTING DISPLAY APPARATUS HAVING PLURALITY OF STRUCTURES UNDER LIGHT EMITTING ELEMENT

(71) Applicant: LG Display Co., Ltd., Seoul (KR)

(72) Inventor: NamSu Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 5 days.

(21) Appl. No.: 16/543,236

(22) Filed: Aug. 16, 2019

(65) Prior Publication Data

US 2020/0136092 A1    Apr. 30, 2020

(30) Foreign Application Priority Data

Oct. 29, 2018   (KR) .................. 10-2018-0130270

(51) Int. Cl.
   *H01L 51/52*   (2006.01)
   *H01L 27/32*   (2006.01)

(52) U.S. Cl.
   CPC ...... *H01L 51/5265* (2013.01); *H01L 27/3246* (2013.01); *H01L 27/3258* (2013.01); *H01L 51/5271* (2013.01); *H01L 2251/5315* (2013.01)

(58) Field of Classification Search
   CPC ............. H01L 51/5256; H01L 51/5275; H01L 51/5012; H01L 27/3258; H01L 27/322; H01L 27/3246; H01L 51/5271
   See application file for complete search history.

(56) References Cited

U.S. PATENT DOCUMENTS

| 7,902,748 | B2 | 3/2011 | Cok | |
| 2005/0285509 | A1* | 12/2005 | Funamoto | H01L 51/5275 313/504 |
| 2008/0218058 | A1* | 9/2008 | Son | H01L 51/5218 313/500 |
| 2010/0123384 | A1 | 5/2010 | Miller et al. | |
| 2010/0176717 | A1* | 7/2010 | Lee | H01L 51/5271 313/504 |
| 2014/0138642 | A1* | 5/2014 | Kim | H01L 51/5209 257/40 |
| 2014/0367669 | A1* | 12/2014 | Takeuchi | H01L 51/56 257/40 |

(Continued)

FOREIGN PATENT DOCUMENTS

| CN | 1503606 B | 9/2010 |
| JP | 2012-78720 A | 4/2012 |

(Continued)

OTHER PUBLICATIONS

Liu Jing et al., "Photoelectric characteristics of silicon P—N junction with nanopillar texture: Analysis of X-ray photoelectron spectroscopy", Chin. Phys. B, vol. 23, No. 9, (2014) 096101.

*Primary Examiner* — Michael Jung
(74) *Attorney, Agent, or Firm* — Birch, Stewart, Kolasch & Birch, LLP

(57) ABSTRACT

A light emitting display apparatus can include a substrate; an over coating layer disposed on the substrate; a plurality of structures on the over coating layer, each of the plurality of structures including a flat upper surface; a reflective layer disposed on the plurality of structures; and a light emitting element disposed on the plurality of structures and the reflective layer.

13 Claims, 9 Drawing Sheets

(56) References Cited

U.S. PATENT DOCUMENTS

| | | | | |
|---|---|---|---|---|
| 2015/0048318 A1* | 2/2015 | Kim | ............... | H01L 27/326 |
| | | | | 257/40 |
| 2016/0149154 A1* | 5/2016 | Park | ............... | H01L 51/5209 |
| | | | | 257/40 |
| 2016/0155787 A1* | 6/2016 | Lee | ............... | H01L 27/3258 |
| | | | | 257/72 |
| 2016/0365392 A1* | 12/2016 | Li | ............... | H01L 27/3232 |
| 2017/0243932 A1* | 8/2017 | Ohara | ............... | H01L 51/5012 |
| 2017/0294493 A1* | 10/2017 | Yoo | ............... | H01L 27/3218 |
| 2018/0053815 A1* | 2/2018 | Lee | ............... | H01L 27/322 |
| 2019/0165318 A1* | 5/2019 | Choi | ............... | H01L 51/56 |
| 2019/0189715 A1* | 6/2019 | Nendai | ............... | H01L 51/5271 |

FOREIGN PATENT DOCUMENTS

| | | |
|---|---|---|
| JP | 5242803 B2 | 7/2013 |
| KR | 10-2017-0137683 A | 12/2017 |
| WO | WO 2009/022316 A2 | 2/2009 |

* cited by examiner

LIGHT EMITTING DISPLAY APPARATUS HAVING PLURALITY OF STRUCTURES UNDER LIGHT EMITTING ELEMENT

CROSS-REFERENCE TO RELATED APPLICATIONS

This application claims the priority of Korean Patent Application No. 10-2018-0130270 filed on Oct. 29, 2018, in the Republic of Korea, the entirety of which is incorporated herein by reference.

BACKGROUND

Technical Field

The present disclosure relates to a light emitting display apparatus, and more particularly, to a light emitting display apparatus which is capable of improving light extraction efficiency, improving outdoor visibility, and achieving a micro cavity effect.

Description of the Related Art

Currently, as society enters a full-scale information era, a field for display apparatuses which visually express electrical information signals has been rapidly developed and studies continue to improve performance of various display apparatuses, such as a thin-thickness, a light weight, and low power consumption.

Among various display apparatus, a light emitting display apparatus is a self-emitting display apparatus so that a separate light source is not necessary (e.g., OLED), which is different from the liquid crystal display apparatus. Therefore, the light emitting display apparatus may be manufactured to have a light weight and a thin-thickness. Further, since the light emitting display apparatus is driven at a low voltage, it is advantageous not only in terms of power consumption, but also in terms of color implementation, a response speed, a viewing angle, and a contrast ratio (CR). Therefore, it is expected to be utilized in various fields.

SUMMARY

Light emitted from a light emitting layer of the light emitting display apparatus passes through various components of the light emitting display apparatus to be output to the outside of the light emitting display apparatus. However, some of the light emitted from the light emitting layer may not be output to the outside of the light emitting display apparatus, but may be confined inside the light emitting display apparatus so that the light extraction efficiency of the light emitting display apparatus becomes an issue.

For example, there is a problem in that some light among light emitted from the light emitting layer is confined in the light emitting display apparatus due to a total reflection loss, a waveguide loss, and a surface plasmon loss. Here, the total reflection loss refers to degradation of light extraction efficiency due to light confined in the light emitting display apparatus by the total reflection at an interface between a substrate and air, among the light emitted from the light emitting layer. The waveguide loss refers to degradation of light extraction efficiency due to light confined therein due to the total reflection at the interface of components in the light emitting display apparatus. The surface plasmon loss refers to the light that vibrates free electrons of the metal surface due to a phenomenon that light is absorbed onto a metal surface during a process of entering and propagating the light so that the light cannot be reflected or transmitted, which degrades the light extraction efficiency.

The inventor of the present disclosure recognized that in order to improve an light extraction efficiency of the light emitting element, when a light emitting element is formed on a lens structure after forming a rounded curved surface such as a lens structure or a wrinkled structure, an anode, a light emitting layer, and a cathode are formed in accordance with a shape of the rounded surface as it is. Therefore, the inventor of the present disclosure recognized that when the light emitting element is formed in accordance with a shape of the rounded surface, there is a problem in that scattering reflectance in an off-state of the light emitting display apparatus is increased so that a visual sense in an off-state, that is, a visual sense in black may be degraded and thus not only the outdoor visibility, but also the contrast ratio is degraded.

Further, the inventor of the present disclosure recognized that when the light emitting element is manufactured in accordance with the shape of the rounded surface as described above, the micro cavity effect cannot be appropriately implemented. For example, the inventor of the present disclosure recognized that when the light emitting element is formed on the lens structure or the wrinkled structure, it is difficult to control an optical distance in the light emitting element and thus it is difficult to maintain the micro cavity effect.

Accordingly, the inventor of the present disclosure invented a light emitting display apparatus with a novel structure which is capable of improving the light extraction efficiency and outdoor visibility, and maintaining the micro cavity effect.

An object to be achieved by embodiments of the present disclosure is to provide a light emitting display apparatus which may improve the light extraction efficiency using a plurality of disk-shaped structures.

Further, another object to be achieved by embodiments of the present disclosure is to provide a light emitting display apparatus which may improve an outdoor visibility and a contrast ratio by forming the light emitting element on a flat surface.

Further, another object to be achieved by embodiments of the present disclosure is to provide a light emitting display apparatus which maintains a constant optical distance in the light emitting layer to achieve the micro cavity effect.

Objects of the present disclosure are not limited to the above-mentioned objects, and other objects, which are not mentioned above, can be clearly understood by those skilled in the art from the following descriptions.

According to an aspect of the present disclosure, a light emitting display apparatus includes: a substrate, an over coating layer on the substrate, a plurality of structures on the over coating layer, each of the plurality of structures including a flat upper surface, a reflective layer on the plurality of structures, and a light emitting element on the plurality of structures and the reflective layer. Therefore, the plurality of structures are configured to improve the light extraction efficiency and maintain the micro cavity effect.

According to another aspect of the present disclosure, a light emitting display apparatus includes: a substrate, an over coating layer on the substrate, a light emitting element on the over coating layer, a reflective layer between the over coating layer and the light emitting element, and a plurality of structures between the over coating layer and the reflective layer, the plurality of structures being spaced apart from each other and configured to enhance light extraction efficiency of the light emitting element, wherein each of the plurality of structures has a shape configured to reduce a scattering reflectance of the light emitting element and enhance a visual sense of black for the light emitting element when the light emitting element is off.

Other detailed matters of the embodiments are included in the detailed description and the drawings.

According to embodiments of the present disclosure, plasmon loss is improved using a plurality of structures, thereby improving light extraction efficiency.

According to embodiments of the present disclosure, upper surfaces of the plurality of structures have a flat shape so that the visual sense in black of the light emitting display apparatus is improved, thereby improving the outdoor visibility degradation and the contrast ratio degradation (e.g., blacker blacks can be provided).

According to embodiments of the present disclosure, more area of the light emitting element is disposed on a flat surface to implement the micro cavity effect.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION OF THE EMBODIMENTS

Figure 1:
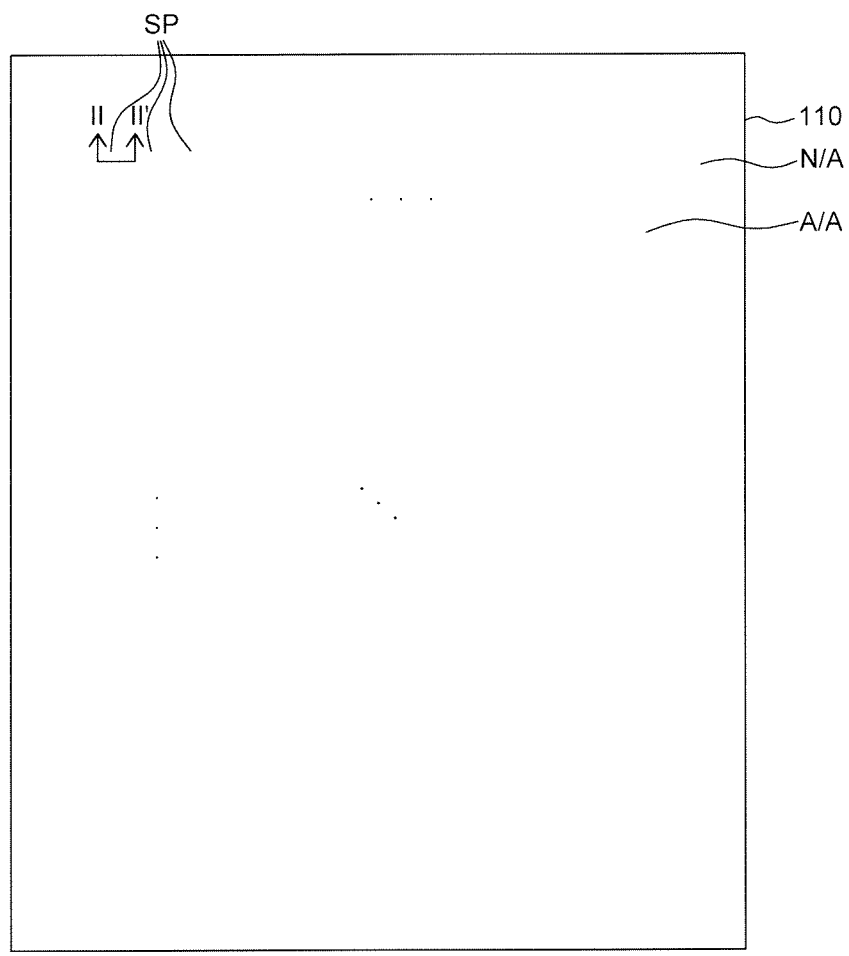
FIG. 1 illustrates a light emitting display apparatus according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a light emitting display apparatus according to embodiments of the present disclosure will be described in detail with reference to accompanying drawings.

Figure 2:
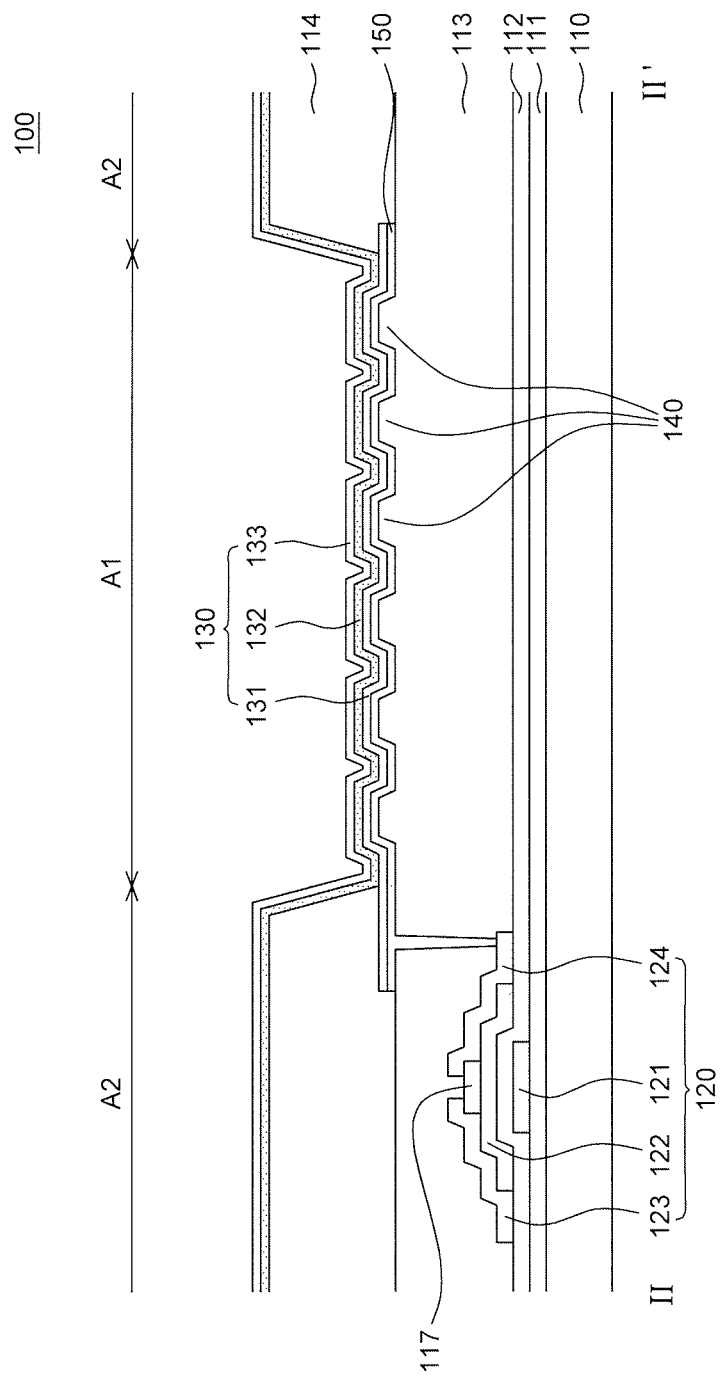
FIG. 2 is a cross-sectional view of a light emitting display apparatus taken along the line II-II' of FIG. 1 according to an embodiment of the present disclosure.

FIG. 1 illustrates a light emitting display apparatus according to an embodiment of the present disclosure. FIG. 2 is a cross-sectional view of a light emitting display apparatus taken along the line II-II' of FIG. 1.

With reference to FIGS. 1 and 2, a light emitting display apparatus 100 includes a substrate 110, a thin film transistor 120, a plurality of structures 140, a reflective layer 150, and a light emitting element 130. The light emitting display apparatus 100 is implemented as a top emission type light emitting display apparatus.

The substrate 110 is a substrate which supports and protects several components of the light emitting display apparatus 100. The substrate 110 can be formed of a glass or a plastic material having flexibility. When the substrate 110 is formed of a plastic material, for example, the substrate can be formed of polyimide (PI), but it is not limited thereto.

The substrate 110 includes a display area A/A and a non-display area N/A.

The display area A/A is an area in which an image is displayed in the light emitting display apparatus 100 and a display element and various driving elements for driving the display element are disposed in the display area A/A. For example, the display element can be configured by a light emitting element 130 including a first electrode 131, a light emitting layer 132, and a second electrode 133 (e.g., an OLED). Further, various driving elements for driving the display element, such as a thin film transistor 120, a capacitor, or a wiring line, can be disposed in the display area A/A.

A plurality of sub pixels SP can be included in the display area A/A. The sub pixel SP is a minimum unit which configures a screen, and each of the plurality of sub pixels SP can include a light emitting element 130 and a driving circuit. The plurality of sub pixels SP can emit light having different wavelengths. For example, the plurality of sub pixels SP can include a red sub pixel SP, a green sub pixel SP, and a blue sub pixel SP. However, it is not limited thereto and the plurality of sub pixels SP can further include a white sub pixel SP.

The driving circuit of the sub pixel SP is a circuit for controlling the driving of the light emitting element 130. For example, the driving circuit can be configured to include the thin film transistor 120 and the capacitor, but is not limited thereto.

The non-display area N/A is an area where no image is displayed and various components for driving the plurality of sub pixels SP disposed in the display area A/A can be disposed in the non-display area N/A. For example, a driving IC which supplies a signal for driving the plurality of sub pixels SP and a flexible film, etc. can be disposed.

The non-display area N/A can be an area which encloses the display area A/A as illustrated in FIG. 1, but is not limited thereto. For example, the non-display area N/A can be an area extending from the display area A/A.

With reference to FIG. 2, a buffer layer 111 is disposed on the substrate 110. The buffer layer 111 can improve adhesiveness between layers formed on the buffer layer 111 and the substrate 110 and block alkali components leaked from the substrate 110. The buffer layer 111 can be formed of a single layer of silicon nitride (SiNx) or silicon oxide (SiOx), or a multiple layer of silicon nitride (SiNx) and silicon oxide (SiOx). The buffer layer 111 may be omitted based on a type or a material of the substrate 110, and a structure and a type of a thin film transistor 120.

The thin film transistor 120 is disposed on the substrate 110. The thin film transistor 120 can be used as a driving element of the light emitting display apparatus 100. The thin film transistor 120 includes a gate electrode 121, an active layer 122, a source electrode 123, and a drain electrode 124. In the light emitting display apparatus 100 according to the embodiment of the present disclosure, the thin film transistor 120 has a structure in which the active layer 122 is disposed on the gate electrode 121 and the source electrode 123 and the drain electrode 124 are disposed on the active layer 122. Therefore, the thin film transistor 120 has a bottom gate structure in which the gate electrode 121 is disposed in the lowermost portion, but is not limited thereto.

The gate electrode 121 of the thin film transistor 120 is disposed on the substrate 110. The gate electrode 121 can be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

A gate insulating layer 112 is disposed on the gate electrode 121. The gate insulating layer 112 is a layer for electrically insulating the gate electrode 121 from the active layer 122 and can be formed of an insulating material. For example, the gate insulating layer 112 may be formed as a single layer of silicon nitride (SiNx) or silicon oxide (SiOx) which is an inorganic material or a multiple layer of silicon nitride (SiNx) and silicon oxide (SiOx), but it is not limited thereto.

The active layer 122 is disposed on the gate insulating layer 112. The active layer 122 is disposed to overlap the gate electrode 121. For example, the active layer can be formed of an oxide semiconductor or amorphous silicon (a-Si), polycrystalline silicon (poly-Si), or an organic semiconductor.

An etch stopper 117 is disposed on the active layer 122. The etch stopper 117 may be a layer formed to suppress the damage of the surface of the active layer 122 due to the plasma when the source electrode 123 and the drain electrode 124 are patterned using an etching method. A portion of the etch stopper 117 overlaps the source electrode 123 and the other portion overlaps the drain electrode 124. However, the etch stopper 117 may be omitted.

The source electrode 123 and the drain electrode 124 are disposed on the active layer 122 and the etch stopper 117. The source electrode 123 and the drain electrode 124 are disposed on the same layer to be spaced apart from each other. The source electrode 123 and the drain electrode 124 can be in contact with the active layer 122 to be electrically connected to the active layer 122. The source electrode 123 and the drain electrode 124 can be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

An over coating layer 113 is formed on the thin film transistor 120. The over coating layer 113 is an insulating layer which protects the thin film transistor 120 and makes the step of layers disposed on the substrate 110 gentle. The over coating layer 113 can be formed of one of acrylic resin, epoxy resin, phenol resin, polyamide resin, polyimide resin, unsaturated polyester resin, polyphenylene resin, polyphenylene sulfide resin, benzocyclobutene, and photoresist, but is not limited thereto.

A plurality of structures 140 are disposed on the over coating layer 113. The plurality of structures 140 can be formed integrally with the over coating layer 113 as illustrated in FIG. 2. For example, the over coating layer 113 and the plurality of structures 140 are formed of the same material to be simultaneously formed by the same process, for example, by a mask process, but are not limited thereto.

The plurality of structures 140 can have a circular trapezoidal shape with a flat upper surface, for example, a disk shape. For example, the circular trapezoidal shape may be a truncated cone shape. For example, a cross-sectional shape of the plurality of structures 140 can be a trapezoidal shape and a planar shape of the plurality of structures 140 can be a circular shape. In this situation, the upper surface of the plurality of structures 140 has a flat shape. Even though in FIG. 2, it is illustrated that each of the plurality of structures 140 has a circular trapezoidal shape with a flat upper surface, it is not limited thereto and the plurality of structures 140 can have a cylindrical shape with a flat upper surface. For example, a cross-sectional shape of the plurality of structures 140 can be a rectangular shape and a planar shape of the plurality of structures 140 can be a circular shape. In this situation, the plurality of structures 140 can be periodically disposed. Further, a size of the plurality of structures 140 can be a nano unit.

As illustrated in FIG. 2, the plurality of structures 140 are disposed in the first area A1. The first area A1 can be defined by the bank 114 and is an emission area where the light emitting element 130 emits light. The second area A2 is an area where the bank 114 is disposed and is a non-emission area where the light emitting element 130 may not emit light. The plurality of structures 140 are a configuration which improves the light extraction efficiency of the light emitting element 130, improves the outdoor visibility and maintains the micro cavity effect so that it can be disposed in the first area A1 which is an emission area. The above-described effect obtained by using the plurality of structures 140 will be described below.

Even though in FIG. 2, it is illustrated that the plurality of structures 140 are disposed only in the first area A1, but it is not limited thereto. For example, the plurality of structures 140 can be disposed in both the first area A1 and the second area A2.

A reflective layer 150 is disposed on the over coating layer 113 and the plurality of structures 140. Because the light emitting display apparatus 100 according to the embodiment of the present disclosure is a top emission type light emitting display apparatus, the reflective layer 150 functions to upwardly reflect the light emitted from the light emitting element 130. Therefore, the reflective layer 150 can be formed of a metal material, such as an aluminum (Al), a silver (Ag), a copper (Cu), and a magnesium-silver alloy (Mg:Ag), but is not limited thereto. The reflective layer 150 is formed in the first area A1 and a partial area of the second area A2 and is electrically connected to the drain electrode 124 through a contact hole in the over coating layer 113. However, it is not limited thereto and the reflective layer 150 can be electrically connected to the source electrode 123.

As the reflective layer 150 is disposed on the over coating layer 113 and the plurality of structures 140 in the first area A1, the reflective layer 150 can be formed along an upper surface of the over coating layer 113 and a side and an upper surface of the plurality of structures 140. Therefore, the reflective layer 150 has a flat upper surface on the upper surface of the over coating layer 113 and the upper surface of the plurality of structures 140 and has an inclined upper surface on the side surface of the plurality of structures 140.

With reference to FIG. 2, the light emitting element 130 is disposed on the plurality of structures 140 and the reflective layer 150. For example, the light emitting element 130 is disposed to overlap both the plurality of structures 140 and the reflective layer 150. The light emitting element 130 includes a first electrode 131 on the reflective layer 150, a light emitting layer 132 on the first electrode 131, and a second electrode 133 on the light emitting layer 132.

The first electrode 131 is disposed on the reflective layer 150. The first electrode 131 is disposed on the reflective layer 150 and is electrically connected to the drain electrode 124 through the reflective layer 150, but it is not limited thereto. The reflective layer 150 is not connected to the drain electrode 124, but the first electrode 131 can be directly connected to the drain electrode 124. The first electrode 131 can be formed of a conductive material having a high work function to supply holes to the light emitting layer 132. For example, the first electrode 131 can be formed of a transparent conductive oxide such as indium tin oxide (ITO), indium zinc oxide (IZO), indium tin zinc oxide (ITZO), zinc oxide (ZnO), and tin oxide (TO). Even though it is described that the first electrode 131 and the reflective layer 150 are separate components in the present disclosure, it is not limited thereto. For example, the first electrode 131 can be configured by a transparent conductive layer and the reflective layer 150.

As the first electrode 131 is disposed on the reflective layer 150 in the first area A1, the first electrode 131 is also formed along the upper surface of the over coating layer 113 and the side and the upper surface of the plurality of structures 140. Therefore, the first electrode 131 has a flat upper surface on the upper surface of the over coating layer 113 and the upper surface of the plurality of structures 140 and has an inclined upper surface on the side surface of the plurality of structures 140.

The light emitting layer 132 is a layer for emitting light having a specific color and includes at least one of a red light emitting layer, a green light emitting layer, a blue light emitting layer, and a white light emitting layer. Further, the light emitting layer 132 can further include various layers, such as a hole transport layer, a hole injecting layer, a hole blocking layer, an electron injecting layer, an electron blocking layer, or an electron transport layer. The light emitting layer 132 may be an organic light emitting layer formed of an organic material, but is not limited thereto. For example, the light emitting layer 132 can be a quantum dot light emitting layer or a micro LED.

As the light emitting layer 132 is disposed on the first electrode 131 in the first area A1, the light emitting layer 132 is also formed along the upper surface of the over coating layer 113 and the side surface and the upper surface of the plurality of structures 140. Therefore, the light emitting layer 132 has a flat upper surface on the upper surface of the over coating layer 113 and an upper surface of the plurality of structures 140 and has an inclined upper surface on the side surface of the plurality of structures 140.

The second electrode 133 is disposed on the light emitting layer 132. The second electrode 133 supplies electrons to the light emitting layer 132. The second electrode 133 can be formed of a transparent conductive oxide such as indium tin oxide (ITO), indium zinc oxide (IZO), indium tin zinc oxide (ITZO), zinc oxide (ZnO), and tin oxide (TO) or an ytterbium (Yb) alloy. Alternatively, the second electrode 133 can be formed of a metal material, such as a silver (Ag), a copper (Cu), or a magnesium-silver alloy (Mg:Ag).

As the second electrode 133 is disposed on the light emitting layer 132 in the first area A1, the second electrode 133 is also formed along the upper surface of the over coating layer 113 and the side and the upper surface of the plurality of structures 140. Therefore, the second electrode 133 has a flat upper surface on the upper surface of the over coating layer 113 and an upper surface of the plurality of structures 140 and has an inclined upper surface on the side surface of the plurality of structures 140. For example, the reflection layer 150 can follow contours of the plurality of structures 140, first electrode 131 can follow contours of the reflection layer 150, the light emitting layer 132 can follow contours of the first electrode 131, and the second electrode 133 can follow contours of the light emitting layer 132).

For example, the light emitting display apparatus 100 according to the embodiment of the present disclosure is a top emission type light emitting display apparatus so that the light emitting display apparatus 100 can be manufactured to implement a micro cavity. For example, in the light emitting display apparatus 100 according to the embodiment of the present disclosure, a distance between the reflective layer 150 and the second electrode 133 is adjusted so that a constructive interference for light emitted from the light emitting layer 132 is implemented to improve the light extraction efficiency.

A bank 114 is disposed on the first electrode 131 and the over coating layer 113. The bank 114 can cover a part of the first electrode 131 of the light emitting element 130 to define the first area A1 which is an emission area. The bank 114 can be formed of an organic material. For example, the bank 114 can be formed of polyimide, acrylic or benzocyclobutene resin, but is not limited thereto.

Further, an encapsulating layer can be formed on the light emitting element 130 to protect the light emitting element 130 from being exposed to moisture, which is vulnerable to moisture. For example, the encapsulating layer can have a structure in which inorganic layers and organic layers are alternately laminated, but is not limited thereto.

The light emitting display apparatus 100 according to the embodiment of the present disclosure uses a plurality of structures 140 which is formed integrally with the over coating layer 113 to improve the light extraction efficiency of the light emitting element 130. For example, the plurality of structures 140 is used to implement a concave-convex structure on the surface of the reflective layer 150 which reflects light emitted from the light emitting layer 132 to the second electrode 133 (e.g., the plurality of structures 140 can be a plurality of concave-convex structures or mesa shape structures). Therefore, free electron vibration on the surface of the first electrode 131 is suppressed to improve the surface plasmon loss. Further, the loss due to the internal total reflection is also improved by the concave-convex structure by the plurality of structures 140. Therefore, the amount of light extracted to the outside can be increased. Accordingly, the power consumption of the light emitting display apparatus 100 can be reduced.

Further, in the light emitting display apparatus 100 according to the embodiment of the present disclosure, the reflective layer 150 has a flat upper surface on the upper surface of the over coating layer 113 and the upper surface of the plurality of structures 140. Therefore, the scattering reflectance in an off-state can be reduced. In the situation of the light emitting display apparatus of the related art, in order to improve the light extraction efficiency, after forming a circular curved surface, such as a lens shape or a wrinkled structure, the reflective layer and the light emitting element are formed. However, in this situation, when the light emitting display apparatus is in an off-state or displays a black image, a lot of light may be scattered from the reflective layer and the light emitting element formed along the circular curved surface, such as a lens structure or a wrinkled structure. Therefore, the outdoor visibility may be reduced and the contrast ratio may also be degraded. In contrast, in the light emitting display apparatus 100 according to the embodiment of the present disclosure, the reflective layer 150 has a flat upper surface on the upper surface of the over coating layer 113 and the upper surface of the plurality of structures 140. Therefore, the scattering reflectance in the light emitting display apparatus 100 is reduced to improve the visual sense in black (e.g., can provide blacker blacks), thereby improving the outdoor visibility and suppressing the degradation of the contrast ratio.

In addition, since the light emitting display apparatus 100 according to the embodiment of the present disclosure is a top emission type light emitting display apparatus 100, the micro cavity is implemented so that the light extraction efficiency can be improved by means of the constructive interference between light emitted from the light emitting layer 132. However, in the situation of the light emitting display apparatus of the related art, in order to improve the light extraction efficiency, after forming a circular curved surface, such as a lens shape or a wrinkled structure, the reflective layer and the light emitting element are formed. In the light emitting display apparatus of the related art as described above, even though the light emitted from the light emitting layer is emitted at the same angle, different reflection angles are set depending on an inclination angle of the surface of the reflective layer. Therefore, two types of light emitted at the same angle form different optical paths between the second electrode and the reflective layer so that it is difficult to control an optical distance in the light emitting element and thus it is difficult to maintain the micro cavity effect.

In contrast, in the light emitting display apparatus 100 according to the embodiment of the present disclosure, the reflective layer 150 and the second electrode 133 have flat upper surfaces on the upper surface of the over coating layer 113 and the upper surface of the plurality of structures 140. Therefore, as compared with an example that uses the lens structure or the wrinkled structure to improve the light extraction efficiency, it is easier to control the optical distance in the light emitting element 130 and it is possible to improve the light extraction efficiency and maintain the micro cavity effect.

Figure 3:
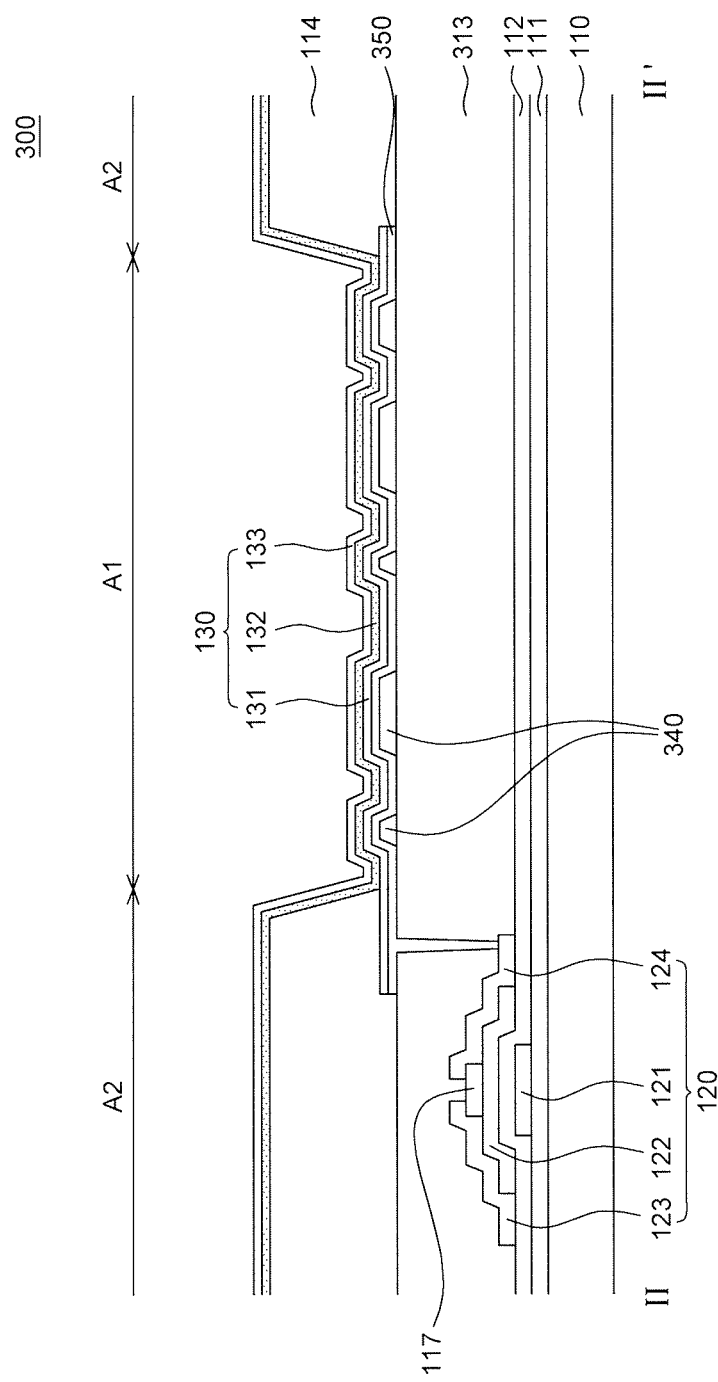
FIG. 3 is a cross-sectional view of a light emitting display apparatus according to another embodiment of the present disclosure.

FIG. 3 is a cross-sectional view of a light emitting display apparatus according to another embodiment of the present disclosure.

An over coating layer 313, a plurality of structures 340, and a reflective layer 350 of a light emitting display apparatus 300 of FIG. 3 are different from those of the light emitting display apparatus 100 of FIGS. 1 and 2, but other configurations are substantially the same so that a redundant description will be omitted.

With reference to FIG. 3, the plurality of structures 340 is disposed on the over coating layer 313. In this situation, the plurality of structures 340 and the over coating layer 313 are disposed to be separated from each other. That is, the plurality of structures 340 and the over coating layer 313 can be defined as separate components, which are disposed on different layers.

The plurality of structures 340 can have a circular trapezoidal shape with a flat upper surface (e.g., a circular mesa shape with sloped sides). For example, the circular trapezoidal shape may be a truncated cone shape. But, it is not limited thereto and the plurality of structures 340 can have a cylindrical shape with a flat upper surface. In this situation, the plurality of structures 340 can have at least two or more different sizes. All the plurality of structures 340 can have different sizes and some of the plurality of structures 340 has a first size and the others can have a second size which is different from the first size.

Further, the plurality of structures 340 can be aperiodically disposed on the over coating layer 313. For example, the plurality of structures 340 are not formed to have a regular pattern, but in some areas, a density of the plurality of structures 340 can be high and in the other areas, a density of the plurality of structures 340 can be low. Further, distances between the plurality of structures 340 can vary.

As illustrated in FIG. 3, the plurality of structures 340 can be formed using a self-assembly material. First, after forming the over coating layer 313, a material layer for forming the plurality of structures 340 is formed on the over coating layer 313. Next, a self-assembly material layer is formed on the material layer for forming the plurality of structures 340. Next, a post-treatment process is performed on the self-assembly material layer to be disposed on the material layer for forming the plurality of structures 340 in the form of a plurality of minute structures. Thereafter, the material layer for forming the plurality of structures 340 is dry-etched with the plurality of minute structures as a mask. As a result of the dry etching process, only the material layer for forming the plurality of structures 340 disposed below the plurality of minute structures remains so that the plurality of structures 340 is formed. Thereafter, the plurality of minute structures formed of the self-assembly material can be removed by a cleaning process. By means of the above-described process, the plurality of structures 340 with a flat upper surface can be formed.

Therefore, the plurality of structures 340 can be formed of a dry-etchable material and the self-assembly material can be formed of a material on which the dry etching cannot be performed. For example, the plurality of structures 340 can use materials such as oxide, silicon, nitride, or an organic material. It is also considered to perform the wet-etching to form the plurality of structures 340. However, since the wet etching process is performed using etchant, the etchant permeates the interface so that it is difficult to precisely form the plurality of structures 340 with a desired shape.

A reflective layer 350 is disposed on the over coating layer 313 and the plurality of structures 340. As the reflective layer 350 is disposed on the over coating layer 313 and the plurality of structures 340 in the first area A1, the reflective layer 350 can be formed along the upper surface of the over coating layer 313 and the side and the upper surface of the plurality of structures 340. Therefore, the reflective layer 350 has a flat upper surface on the upper surface of the over coating layer 313 and the upper surface of the plurality of structures 340 and has an inclined upper surface on the side surface of the plurality of structures 340.

Therefore, in the light emitting display apparatus 300 according to another embodiment of the present disclosure, the plurality of aperiodical structures 340 are formed on the over coating layer 313 so that the surface plasmon loss and the internal total reflection loss are improved, in order to improve the efficiency of the light extraction. Therefore, the efficiency of the light extracted to the outside of the light emitting element 130 is improved to reduce the power consumption and ensure the electrical stability of the light emitting element 130. Further, the reflective layer 350 has a flat upper surface so that the scattering reflectance in the light emitting display apparatus 300 is reduced to improve the visual sense in black. Therefore, the outdoor visibility is improved and the degradation of the contrast ratio is suppressed.

In addition, when the plurality of structures are periodically formed so that the reflective layer 350 also has a periodic concave-convex structure, constructive interference and destructive interference can be generated along a traveling direction of light which is reflected from the reflective layer 350. As a result, diffractive interference or moiré interference may be generated. In this situation, there may be a problem in that a user visibly recognizes interference fringe, such as a wave pattern.

Therefore, in the light emitting display apparatus 300 according to another embodiment of the present disclosure, the plurality of structures 340 are aperiodically disposed and the plurality of structures 340 has various sizes so that the reflective layer 350 can also have an irregular concave-convex structure. Accordingly, the light emitting display apparatus 300 according to another embodiment of the present disclosure can solve the problem in that a user visibly recognizes the interference fringe due to the diffractive interference or moiré interference of light.

Figure 4:
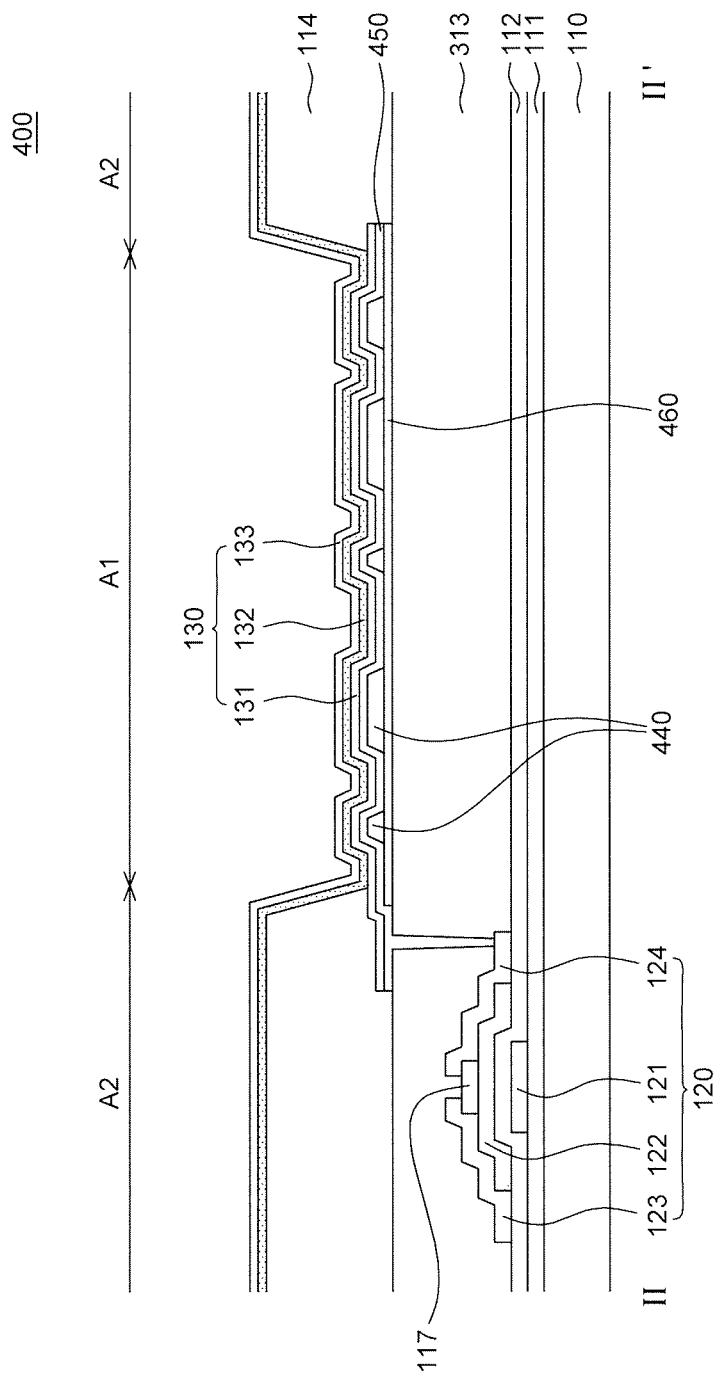
FIG. 4 is a cross-sectional view of a light emitting display apparatus according to another embodiment of the present disclosure.

FIG. 4 is a cross-sectional view of a light emitting display apparatus according to another embodiment of the present disclosure.

A light emitting display apparatus 400 of FIG. 4 is different from the light emitting display apparatus 300 of FIG. 3 in that an intermediate layer 460 is further included and a plurality of structures 440 is different, but other configurations are substantially the same so that a redundant description will be omitted.

With reference to FIG. 4, an intermediate layer 460 is disposed on the over coating layer 313 and a plurality of structures 440 are disposed on the intermediate layer 460. Therefore, the intermediate layer 460 is disposed between the over coating layer 313 and the plurality of structures 440.

The intermediate layer 460 is a layer which suppresses the damage of an upper surface of the over coating layer 313 during the process of forming the plurality of structures 440 and functions as an etch stopper. As described above, when the plurality of structures 440 is formed using the self-assembly material, the dry etching process can be performed on the material layer for forming the plurality of structures 440. In this situation, when the over coating layer 313 is formed of an material which is etched while performing the dry etching for forming the plurality of structures 440, the upper surface of the over coating layer 313 may be damaged during the dry etching process. Therefore, the intermediate layer 460 can be formed of a material which has a different dry etching condition from that of the material which forms the plurality of structures 440. For example, the intermediate layer 460 can be formed of a metal material and thus it is not etched during the dry etching process and has a flat upper surface.

In the light emitting display apparatus 400 according to another embodiment of the present disclosure, the intermediate layer 460 functioning as an etch stopper is disposed between the over coating layer 313 and the plurality of structures 440. When the intermediate layer 460 is not used, during the process of forming the plurality of structures 440, the upper surface of the over coating layer 313 may be damaged and thus the upper surface of the over coating layer 313 may not be flat. When the upper surface of the over coating layer 313 is not flat, the reflective layer 450 and the light emitting element 130 which are disposed on the upper surface of the over coating layer 313 are also not disposed to be flat. Therefore, a lot of light may be scattered from the reflective layer 450 and the light emitting element 130 so that the outdoor visibility is lowered and the contrast ratio is degraded. Further, it may be difficult to control the optical distance in the light emitting element 130. Therefore, in the light emitting display apparatus 400 according to another embodiment of the present disclosure, the intermediate layer 460 formed of a material which has a different dry etching condition from that of the material which forms the plurality of structures 440 is disposed between the over coating layer 313 and the plurality of structures 440. Therefore, the damage of the over coating layer 313 during the process of forming the plurality of structures 440 can be suppressed and a flat upper surface can be provided and the height of the plurality of structures 440 can be more precisely controlled (e.g., a flatter upper surface of the over coating layer can be ensured, since it is protected from pitting or etching, by intermediate layer 460).

Figure 5A:
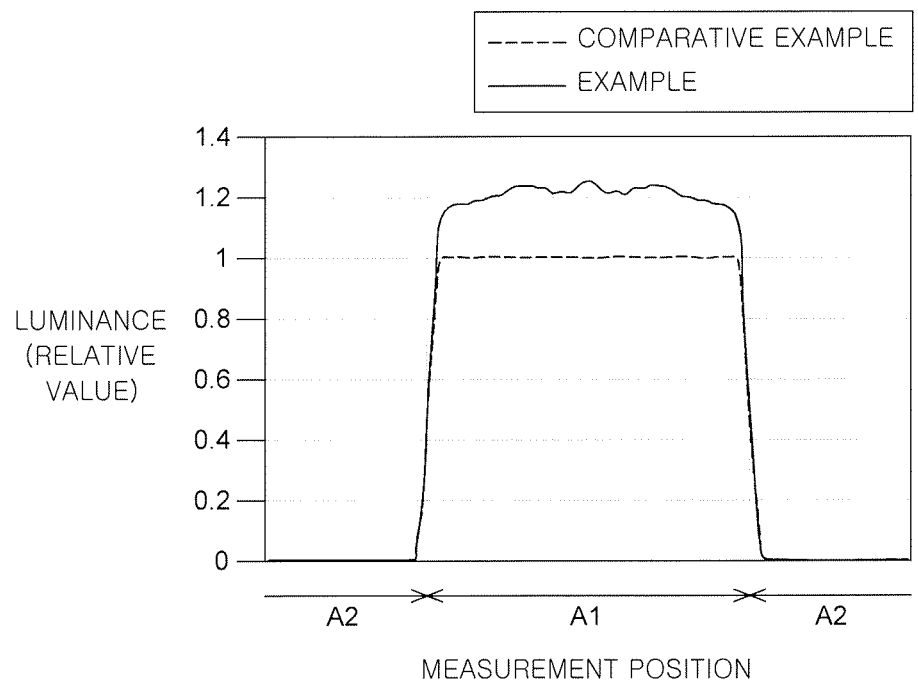
FIGS. 5A and 5B are graphs for explaining a light efficiency of a comparative example and an embodiment of the present disclosure.
Figure 5B:
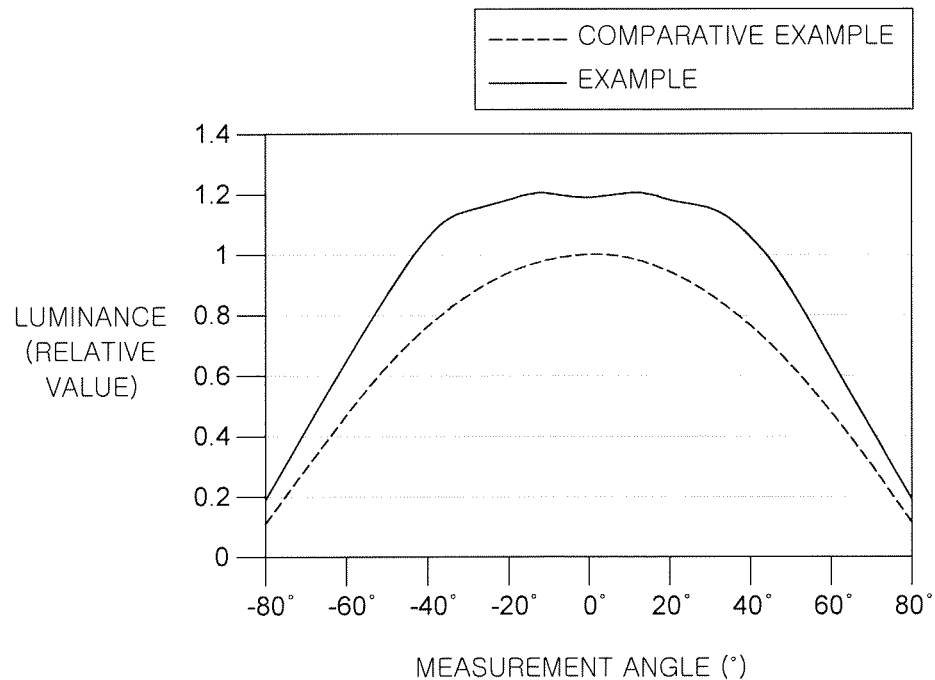

FIGS. 5A and 5B are graphs for explaining an optical efficiency of a comparative example and an example of an embodiment of the present disclosure.

FIG. 5A is a graph for explaining an optical efficiency for a comparative example and an example in accordance with a measurement position and FIG. 5B is a graph for explaining an optical efficiency for a comparative example and an example in accordance with a measurement angle. The example is the light emitting display apparatus 100 described with reference to FIGS. 1 and 2 and the comparative example is an example in which the plurality of structures 140 are removed from the light emitting display apparatus 100 described with reference to FIGS. 1 and 2 so that the reflective layer 150 and the light emitting element 130 are disposed on the over coating layer 113. In FIG. 5A, an X-axis represents a position corresponding to the first area A1 and the second area A2 described with reference to FIGS. 1 to 2 as a luminance measurement position and a Y-axis represents a relative value of the luminance obtained by normalizing a maximum luminance measured in the comparative example as 1.00. In FIG. 5B, the X-axis represents a luminance measurement angle, that is, a viewing angle and the Y-axis represents a relative value of the luminance obtained by normalizing the maximum luminance measured in the comparative example as 1.00.

First, with reference to FIG. 5A, the comparative example is a top emission type light emitting display apparatus in which a first area A1, where a plurality of structures 140 are not disposed, functions as an emission area. Therefore, as illustrated in FIG. 5A, the luminance is sharply changed at a boundary of the first area A1 and the second area A2.

Next, in order to solve the degradation of the luminance generated in the comparative example, in the example, a plurality of structures 140 are formed. Therefore, it is confirmed that the light extraction efficiency is improved by the concave-convex structure of the reflective layer 150 disposed on the plurality of structures 140 so that the luminance in the first area A1 is higher than that of the comparative example.

Next, With reference to FIG. 5B, it is confirmed that since the plurality of structures 140 are provided in the example, the luminance of the example at all measurement angles of 80° to −80° is higher than the luminance of the comparative example.

Figure 6A:
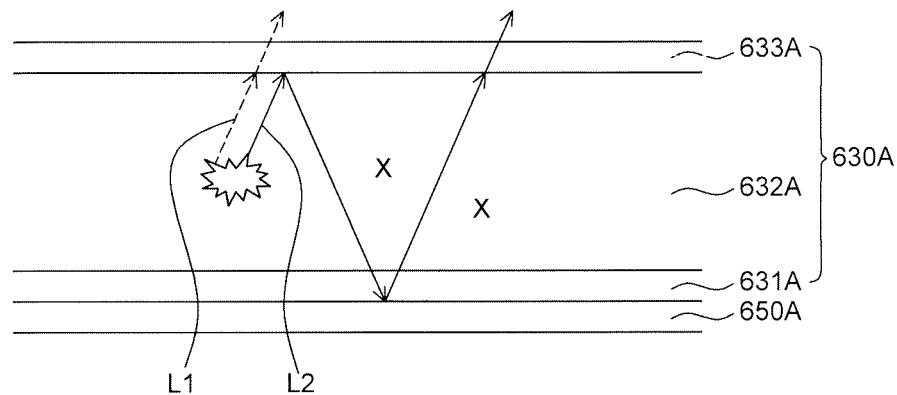
FIGS. 6A to 6C are schematic cross-sectional views for explaining an optical path of light emitted from a light emitting layer of a comparative example and an embodiment of the present disclosure.
Figure 6B:
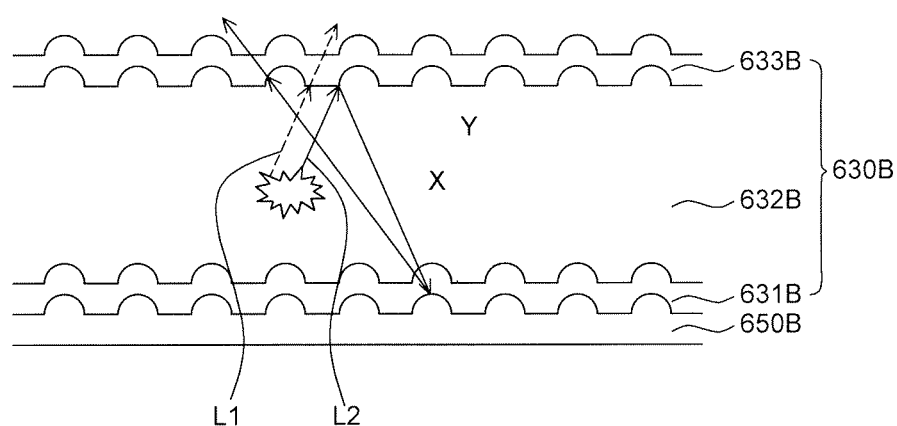
Figure 6C:
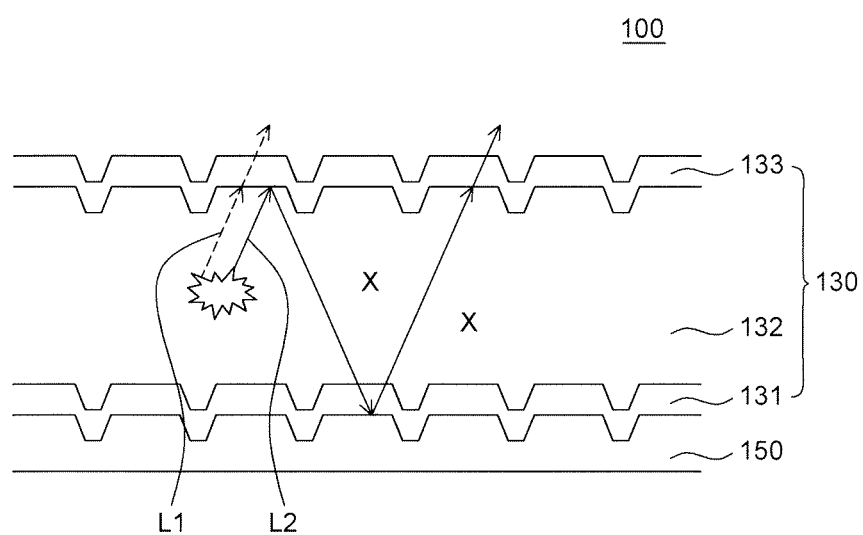

FIGS. 6A to 6C are schematic cross-sectional views for explaining an optical path of light emitted from a light emitting layer of a comparative example and an example of the present disclosure.

FIG. 6A is a cross-sectional view for explaining the micro cavity effect and an optical distance in a comparative example 1, FIG. 6B is a cross-sectional view for explaining the micro cavity effect and an optical distance in a comparative example 2, and FIG. 6C is a cross-sectional view for explaining the micro cavity effect and an optical distance in an example. For example, the example is the light emitting display apparatus 100 described with reference to FIGS. 1 and 2. The comparative example 1 is an example in which a plurality of structures 140 are removed from the light emitting display apparatus 100 described with reference to FIGS. 1 and 2 and a reflective layer 650A and a light emitting element 630A are disposed on an over coating layer 113. The comparative example 2 is an example in which the plurality of structures 140 are removed from the light emitting display apparatus 100 described with reference to FIGS. 1 and 2 and a lens structure is used. In FIGS. 6A to 6C, only reflective layers 150, 650A, and 650B and light emitting elements 130, 630A, and 630B are schematically illustrated. Further, for the convenience of description, in FIG. 6B, the lens structure is not illustrated and it is assumed that an upper surface of the reflective layer 650B has a shape corresponding to the lens structure. Further, in FIG. 6C, the plurality of structures 140 are not illustrated and it is assumed that an upper surface of the reflective layer 150 has a shape corresponding to the plurality of structures 140. It is assumed that first light L1 and second light L2 illustrated in FIGS. 6A to 6C are light emitted from the light emitting layers 132, 632A, and 632B at the same angle. It is further assumed that the first light L1 is emitted from the light emitting layer 132, 632A, and 632B and then immediately emitted to the outside. It is also assumed that the second light L2 is emitted from the light emitting layer 132, 632A, and 632B and then reflected at an interface of the light emitting layer 132, 632A, and 632B and the second electrode 133, 633A, and 633B once and reflected at an interface of the first electrode 131, 631A, 631B and the reflective layer 150, 650A, 650B once and then emitted to the outside.

First, with reference to FIG. 6A, in the comparative example 1, because the reflective layer 650A, the first electrode 631A, the light emitting layer 632A, and the second electrode 633A have the flat shape, an optical path difference of the first light L1 and the second light L2 emitted at the same angle can be maintained to be 2× all the time. Therefore, in the comparative example 1, it is easiest to control the optical distance in the light emitting element 630A and the strongest micro cavity effect can be implemented. However, since in the comparative example 1, the plurality of structures are not included, both the reflective layer 650A and the light emitting element 630A have the flat shape, so that the light extraction efficiency may be lowered.

Next, With reference to FIG. 6B, in the comparative example 2, the upper surface of the reflective layer 650B has a shape corresponding to the lens structure so that the first electrode 631B, the light emitting layer 632B, and the second electrode 633B also have a shape corresponding to the lens structure. Therefore, as illustrated in FIG. 6B, the optical path difference of the first light L1 and the second light L2 emitted at the same angle is not maintained to be 2×, but may be defined as X+Y. Further, the angles reflected at the interface of the second electrode 633B and the light emitting layer 632B and the interface of the first electrode 631B and the reflective layer 650B vary depending on an initial emission angle of the first light L1 and the second light L2 at every time. Therefore, X and Y also have different values at every emission angle and every emission position. Therefore, in the comparative example 2, it is very difficult to control the optical distance in the light emitting element 630B and the weakest micro cavity effect may be implemented. However, in the comparative example 2, the lens structure is included so that the light extraction efficiency may be improved as compared with the comparative example 1.

Next, With reference to FIG. 6C, in the example, the reflective layer 150 has a shape corresponding to the plurality of structures 140 so that the first electrode 131, the light emitting layer 132, and the second electrode 133 also have the shape corresponding to the plurality of structures 140. Therefore, a probability that the optical path difference of the first light L1 and the second light L2 emitted at the same angle is maintained to be 2× all the time can be higher than that of the comparative example 2. Also in the example, it is not easy to control the optical distance of the light which is incident onto the inclined portion of the reflective layer 150 in the light emitting element 130. However, differently from the comparative example 2, in the example, the reflective layer 150 has a flat upper surface, so that the optical distance in the light emitting element 130 can be much easier to control than that in the comparative example 2. Further, in the example, the reflective layer 150 has a concave-convex structure by the plurality of structures 140, so that the light extraction efficiency can be improved.

Hereinafter, the micro cavity effect can be described in more detail with reference to FIGS. 7A and 7B.

Figure 7A:
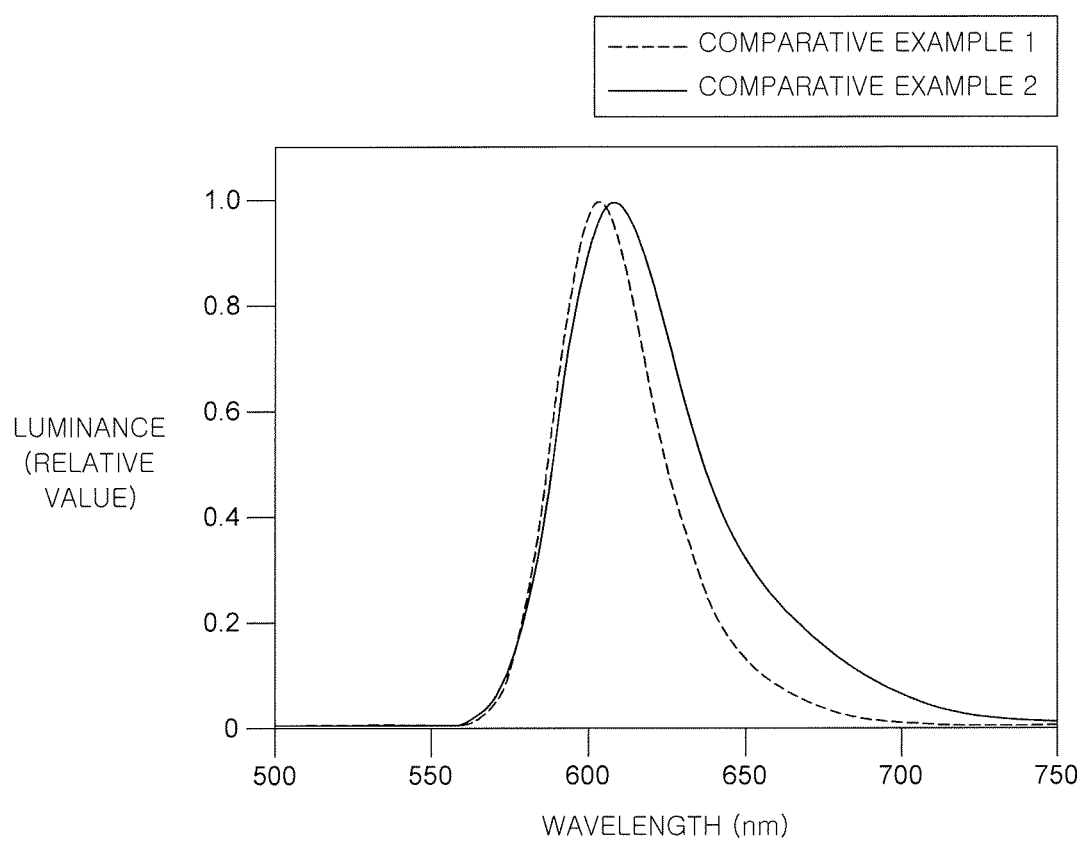
FIGS. 7A and 7B are graphs for explaining a micro cavity effect of a comparative example and an embodiment of the present disclosure.
Figure 7B:
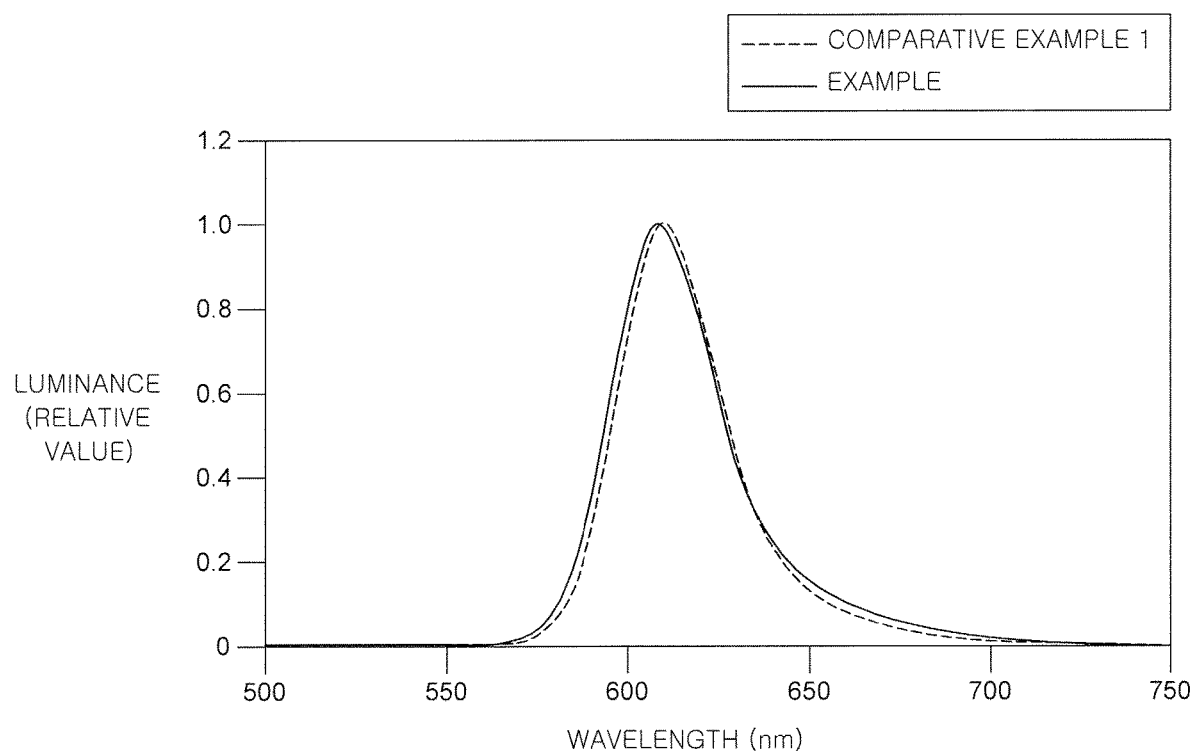

FIGS. 7A and 7B are graphs for explaining a micro cavity effect of a comparative example and an example of embodiments of the present disclosure.

FIG. 7A is a graph for explaining a micro cavity effect in the comparative example 1 and the comparative example 2 and FIG. 7B is a graph for explaining a micro cavity effect in the comparative example 1 and the example. In this situation, the comparative example 1, the comparative example 2, and the example are the same as the comparative example 1, the comparative example 2, and the example described with reference to FIGS. 6A to 6C. In FIGS. 7A and 7B, the X-axis represents a wavelength and the Y-axis is a value obtained by normalizing a maximum luminance as 1.00.

First, with reference to FIG. 7A, in the comparative example 1, as described above, the reflective layer 650A and the light emitting element 630A make it easy to control the optical distance in the light emitting element 630A to be maintained. Therefore, the comparative example 1 is the most advantageous to implement the micro cavity effect and has a spectrum having the smallest half-width.

However, in the comparative example 2, as described above, the upper surface of the reflective layer 650B has the shape corresponding to the lens structure so that the first electrode 631B, the light emitting layer 632B, and the second electrode 633B also have the shape corresponding to the lens structure. Therefore, it is very difficult to control the optical distance in the light emitting element 630B to be maintained. Therefore, in the comparative example 2, the micro cavity characteristic is broken, so that as illustrated in FIG. 7A, the comparative example 2 has a spectrum having a half-width which is much larger than that of the comparative example 1.

Next, with reference to FIG. 7B, in the example, the reflective layer 150 has a shape corresponding to the plurality of structures 140 so that the first electrode 131, the light emitting layer 132, and the second electrode 133 also have the shape corresponding to the plurality of structures 140. Therefore, the control of the optical distance in the light emitting element 130 is much easier than that of the comparative example 2. Therefore, as illustrated in FIG. 7B, the example can have a spectrum having a half-width which is substantially the same as the comparative example 1.

An embodiment of the present disclosure can also be described as follows:

According to an embodiment of the present disclosure, a light emitting display apparatus includes a substrate; an over coating layer on the substrate; a plurality of structures on the over coating layer, each of the plurality of structures having a flat upper surface; a reflective layer on the plurality of structures; and a light emitting element on the plurality of structures and the reflective layer.

For example, in the light emitting display apparatus according to an embodiment of the present disclosure, each of the plurality of structures may have a mesa shape including a flat top surface and sloped sides.

For example, in the light emitting display apparatus according to an embodiment of the present disclosure, an upper surface of the reflective layer may have a flat shape.

For example, in the light emitting display apparatus according to an embodiment of the present disclosure, the plurality of structures may be formed integrally with the over coating layer.

For example, in the light emitting display apparatus according to an embodiment of the present disclosure, the plurality of structures may be separate from the over coating layer.

For example, in the light emitting display apparatus according to an embodiment of the present disclosure, the plurality of structures may be formed of a dry-etchable material.

For example, the light emitting display apparatus according to an embodiment of the present disclosure, may further include an intermediate layer between the over coating layer and the plurality of structures.

For example, in the light emitting display apparatus according to an embodiment of the present disclosure, the intermediate layer may be formed of a material having a different dry etching condition from a material which forms the plurality of structures.

For example, in the light emitting display apparatus according to an embodiment of the present disclosure, an upper surface of the intermediate layer may have a flat shape.

For example, in the light emitting display apparatus according to an embodiment of the present disclosure, the plurality of structures may have one of a circular trapezoidal shape and a cylindrical shape.

For example, in the light emitting display apparatus according to an embodiment of the present disclosure, the plurality of structures can be aperiodically disposed.

For example, in the light emitting display apparatus according to an embodiment of the present disclosure, the plurality of structures may include at least two or more sizes.

According to an embodiment of the present disclosure, a light emitting display apparatus includes a substrate; an over coating layer on the substrate; a light emitting element on the over coating layer; a reflective layer between the over coating layer and the light emitting element; and a plurality of structures between the over coating layer and the reflective layer, the plurality of structures being be spaced apart from each other and configured to enhance light extraction efficiency of the light emitting element, in which each of the plurality of structures has a shape configured to reduce a scattering reflectance of the light emitting element and enhance a visual sense of black for the light emitting element when the light emitting element is off.

For example, in the light emitting display apparatus according to an embodiment of the present disclosure, each of the plurality of structures may have a mesa shape including a flat top surface and sloped sides.

For example, in the light emitting display apparatus according to an embodiment of the present disclosure, an upper surface of each of the plurality of structures may be flat.

For example, in the light emitting display apparatus according to an embodiment of the present disclosure, the plurality of structures may be separate from the over coating layer.

For example, the light emitting display apparatus according to an embodiment of the present disclosure may further include an etch stopper between the over coating layer and the plurality of structures, the tech stopper being configured to reduce damage of the over coating layer when the over coating layer and the plurality of structures are dry-etched using a simultaneously etchable material.

For example, in the light emitting display apparatus according to an embodiment of the present disclosure, the etch stopper may be formed of a material having a different etching ratio for dry etching than the plurality of structures, and the etch stopper has a flat upper surface.

For example, in the light emitting display apparatus according to an embodiment of the present disclosure, the reflective layer may have a flat shape over an upper surface of each of the plurality of structures and an upper surface of the etch stopper exposed by the plurality of structures, and the reflective layer is configured to maintain a micro cavity effect of the light emitting element.

According to an embodiment of the present disclosure, a light emitting display apparatus can include a sub pixel disposed on a substrate, bank portions disposed on sides of the sub pixel, an over coating layer disposed between the substrate and the sub pixel, and a plurality of mesa shapes disposed under the sub pixel and between the bank portions, each of the plurality of mesa shapes has a flat upper surface and an inclined side surface.

Although the embodiments of the present disclosure have been described in detail with reference to the accompanying drawings, the present disclosure is not limited thereto and can be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A light emitting display apparatus, comprising:
    a substrate including an emission area and a non-emission area;
    an over coating layer disposed on the substrate;
    a plurality of structures on the over coating layer in the emission area, each of the plurality of structures including a flat upper surface;
    an intermediate layer disposed between the over coating layer and the plurality of structures;
    a reflective layer disposed on the plurality of structures and covering the flat upper surface of each of the plurality of structures; and
    a light emitting element disposed on the plurality of structures and the reflective layer, the light emitting element including a first electrode on the reflective layer, a light emitting layer on the first electrode, and a second electrode on the light emitting layer,
    wherein the plurality of structures are separated from the over coating layer,
    wherein the intermediate layer is formed of a metal material, and
    wherein the plurality of structures are aperiodically disposed and the plurality of structures have various sizes so that the reflective layer has an irregular concave-convex structure.

2. The light emitting display apparatus of claim 1, wherein each of the plurality of structures has a mesa shape including a flat top surface and sloped sides.

3. The light emitting display apparatus of claim 1, wherein an upper surface of the reflective layer has a flat shape.

4. The light emitting display apparatus of claim 1, wherein the plurality of structures are formed of a dry-etchable material.

5. The light emitting display apparatus of claim 1, wherein the intermediate layer is formed of a material having a different dry etching condition from a material which forms the plurality of structures.

6. The light emitting display apparatus of claim 1, wherein an upper surface of the intermediate layer has a flat shape.

7. The light emitting display apparatus of claim 1, wherein the plurality of structures include one of a circular trapezoidal shape or a cylindrical shape.

8. A light emitting display apparatus, comprising:
    a substrate including an emission area and a non-emission area;
    an over coating layer disposed on the substrate;
    a light emitting element disposed on the over coating layer, the light emitting element including a first electrode, a light emitting layer on the first electrode, and a second electrode on the light emitting layer;
    a reflective layer disposed between the over coating layer and the first electrode of the light emitting element;
    a plurality of structures disposed between the over coating layer and the reflective layer in the emission area, the plurality of structures being spaced apart from each other and configured to enhance light extraction efficiency of the light emitting element; and
    an etch stopper disposed between the over coating layer and the plurality of structures and formed of a metal material,
    wherein each of the plurality of structures has a shape configured to reduce a scattering reflectance of the light emitting element and enhance a visual sense of black for the light emitting element when the light emitting element is off,
    wherein the plurality of structures are separated from the over coating layer and a surface of the plurality of structures is covered with the reflective layer, and
    wherein the plurality of structures are aperiodically disposed and the plurality of structures have various sizes so that the reflective layer has an irregular concave-convex structure.

9. The light emitting display apparatus of claim 8, wherein each of the plurality of structures has a mesa shape including a flat top surface and sloped sides.

10. The light emitting display apparatus of claim 8, wherein an upper surface of each of the plurality of structures is flat.

11. The light emitting display apparatus of claim 8, wherein the etch stopper is configured to reduce damage of the over coating layer when the over coating layer and the plurality of structures are dry-etched using an simultaneously etchable material.

12. The light emitting display apparatus of claim 11, wherein the etch stopper is formed of a material having a different etching ratio for dry etching than the plurality of structures, and
    wherein the etch stopper has a flat upper surface.

13. The light emitting display apparatus of claim 12, wherein the reflective layer has a flat shape over an upper surface of each of the plurality of structures and an upper surface of the etch stopper exposed by the plurality of structures, and
    wherein the reflective layer is configured to maintain a micro cavity effect of the light emitting element.

* * * * *